US007787766B2

(12) United States Patent
Ames et al.

(10) Patent No.: US 7,787,766 B2
(45) Date of Patent: Aug. 31, 2010

(54) FAULT SENSOR FOR A LASER DRIVER CIRCUIT

(75) Inventors: Stephen J. Ames, Rochester, MN (US); Steven J. Baumgartner, Zumbro Falls, MN (US); Christopher K. White, Eau Claire, WI (US)

(73) Assignee: JDS Uniphase Corporation, Milpitas, CA (US)

( * ) Notice: Subject to any disclaimer, the term of this patent is extended or adjusted under 35 U.S.C. 154(b) by 799 days.

(21) Appl. No.: 11/563,890

(22) Filed: Nov. 28, 2006

(65) Prior Publication Data
US 2007/0127918 A1   Jun. 7, 2007

Related U.S. Application Data

(60) Provisional application No. 60/742,931, filed on Dec. 6, 2005.

(51) Int. Cl.
 *H04B 10/08*  (2006.01)
 *H04B 10/00*  (2006.01)
(52) U.S. Cl. .......................... 398/22; 398/17; 398/23; 398/135; 398/137

(58) Field of Classification Search .................. 398/17, 398/22, 23, 135, 137
See application file for complete search history.

(56) References Cited

U.S. PATENT DOCUMENTS

| 5,999,549 | A * | 12/1999 | Freitag et al. ............. 372/38.09 |
| 6,792,020 | B2 | 9/2004 | Romm |
| 2004/0105679 | A1* | 6/2004 | Aronson et al. ............. 398/136 |
| 2004/0136720 | A1* | 7/2004 | Mahowald et al. .......... 398/135 |
| 2006/0110157 | A1* | 5/2006 | Tritschler et al. ............. 398/22 |

* cited by examiner

*Primary Examiner*—Ken N Vanderpuye
*Assistant Examiner*—Daniel G Dobson
(74) *Attorney, Agent, or Firm*—Matthew A. Pequignot; Pequignot + Myers LLC

(57) ABSTRACT

An apparatus and method is provided for sensing which faults have occurred in a laser control system, as well as trapping and identifying the first fault occurrence. The apparatus includes an integrated circuit in which a mask register is set by means of a micro-controller or a host system to select which fault sources are to be recorded. A status bit register in which the fault indications are stored can also be interrogated by the micro-controller or a host system. A settable first fault status register determines whether every fault or only the first fault gets recorded.

5 Claims, 1 Drawing Sheet

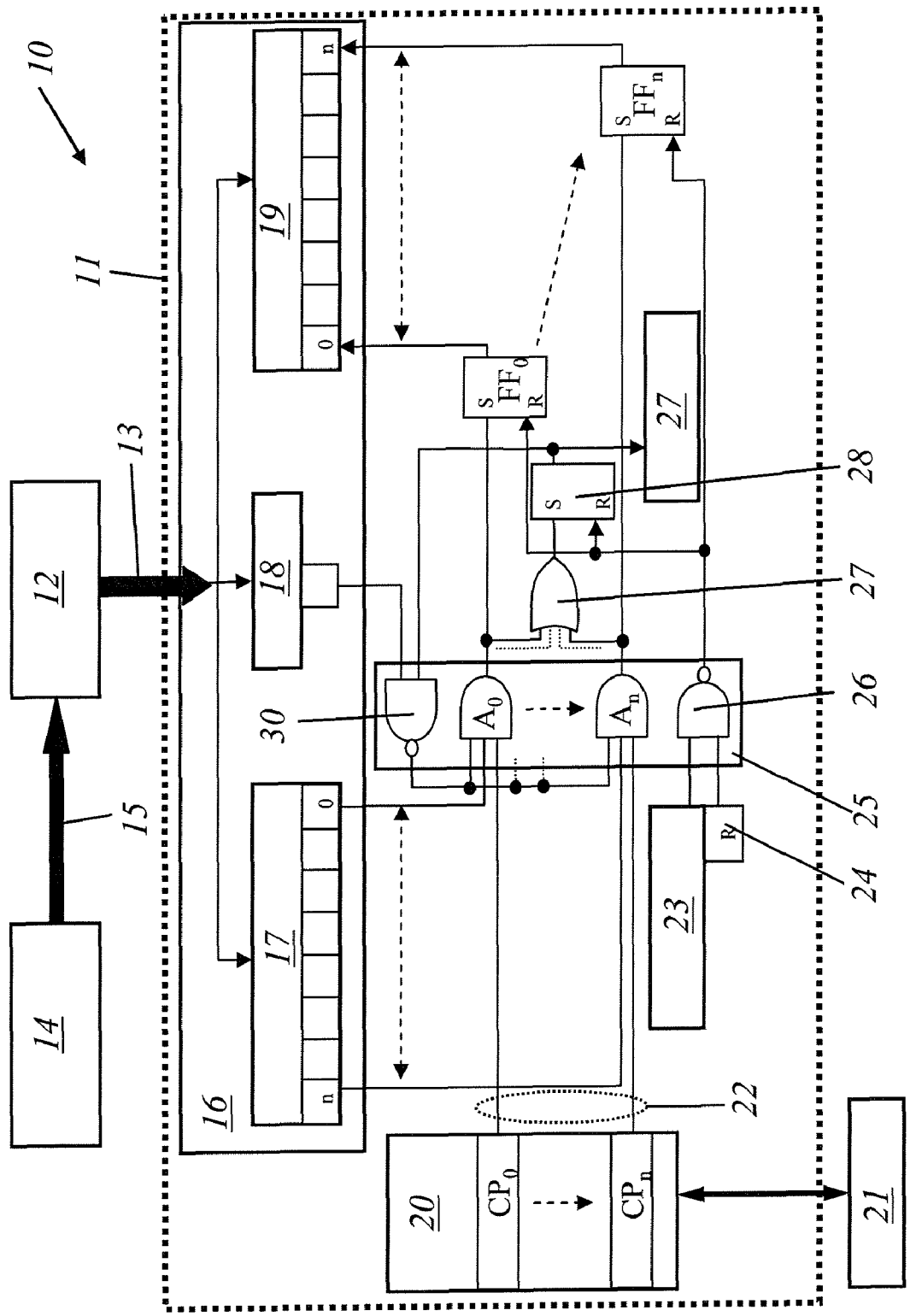

FAULT SENSOR FOR A LASER DRIVER CIRCUIT

CROSS-REFERENCE TO RELATED APPLICATIONS

The present invention claims priority from Patent Application No. 60/742,931 filed Dec. 6, 2005 which is incorporated herein by reference.

TECHNICAL FIELD

The present invention relates to a fault sensing system for a laser driving circuit, and in particular to a fault sensing system for detecting faults, as well as for determining which fault signal was first to occur, in laser drivers for transmitter modules used for telecommunication systems.

BACKGROUND OF THE INVENTION

Most laser drivers have circuitry to detect faults and a single line to indicate the presence of a fault. For instance, Freitag et al., U.S. Pat. No. 5,999,549, disclose an apparatus for detecting laser fault conditions and generating a laser fault control signal, which is used to disable the laser under prescribed conditions. However, the apparatus has only a single input coming from a monitor diode, and produces a single output to indicate a fault condition.

In another example, Romm, U.S. Pat. No. 6,792,020 discloses a driver circuit for an opto-electrical transmitter with a first fault activation circuit in the driver which activates a fault signal that disables the driver, and a second fault activation signal, which times the duration of any periods during which a digital parameter of the driver is outside a target range. From the fault signals provided it is not possible to distinguish which fault condition is the source, nor can the separate fault signals recorded or stored in the driver circuit.

There are several sources of faults that may not be mutually exclusive. The originating fault may cause other faults to be detected as well, for example the original fault may cause the laser to be disabled, which may result in another fault to be reported. In previous designs, fault signals were recorded without any indication of the source or the order in which they occurred. When a fault occurred, there was no way to determine its original source. Determining the source of the fault may thus require a lengthy debugging process.

An object of the present invention is to improve the fault sensing system to provide more information for the identification of originating fault.

Another object of the present invention is to determine the order in which fault signals occur.

SUMMARY OF THE INVENTION

The fault sensing system in this disclosure is an electronic circuit in a custom integrated circuit that is used to control a laser diode source for detecting and recording faults. A common application of such a system would be in an optical transceiver for data transmission and telecommunications. Generally such a system is useful in all applications which use other types of lasers or modules with sensors to detect multiple faults.

To aid in the debugging of recorded faults, a method is developed to record the source of the fault, as well as which fault occurred first in a series of fault occurrences. This provides an ordered methodology for locating and fixing the root cause of the faults. The source and order of the fault is accessible via a digital interface.

Possible sources of faults are (not a complete list):
Over- or under-voltage on the laser cathode;
Over- or under-voltage on the laser anode;
Open or short circuit on the laser cathode;
Open or short circuit on the laser anode;
Over- or under-voltage on the feedback photodetector;
Open or short circuit on the feedback photodetector;
Laser over-current relative to some independent reference.

These faults are not mutually exclusive. The triggering of one fault may result in another source of a fault becoming active resulting in multiple fault indications. It is beneficial for diagnosis to know the originating source of the fault. That results in easier and faster determination of the root cause of the fault.

Accordingly, the present invention relates to providing a fault sensing system with multiple inputs for detecting fault conditions from various sources, and having a means of triggering a general transmitter fault indication as well as a fault register for storing fault source information.

Another aspect of the present invention relates to a method of operating the fault sensing system in a mode which determines and records which fault was the first to occur.

A feature of the present invention also provides for the selection of operating mode of the fault sensing system as well as the interrogation of fault status through a data bus by a micro-controller or a host system.

A fault sensing apparatus in an integrated circuit for connecting to a laser module in a host system is claimed, comprising a laser driving circuit including a plurality of checkpoints, each checkpoint connected to a fault sensor for monitoring a plurality of operating faults in the laser module, wherein each checkpoint performs a comparison with a reference level and outputs a fault signal based on the comparison; a status bit register for separately storing each of the fault signals to enable identification of each operating fault independently.

The fault sensing apparatus defined above, further comprising a logic block between the checkpoints and the status bit register for receiving the fault signals and outputting alarm signals to the status bit register; and a register providing control signals to the logic block for connecting a selection of the fault signals to the alarm signals.

The fault sensing apparatus according to the previous paragraph, wherein the register includes a first fault state register disposed to disable the logic block from outputting any subsequent alarm signals after a first occurrence of a fault signal has been detected.

BRIEF DESCRIPTION OF THE DRAWING

The invention will be described in greater detail with reference to the accompanying drawing which represents a preferred embodiment thereof, wherein:

The single FIGURE is a schematic circuit diagram laying out the main elements of a fault sensing system according to the present invention.

DETAILED DESCRIPTION

With reference to the single FIGURE, an example of the fault sensing system 10 according to the present invention is an electronic circuit in a custom integrated circuit (IC) 11 that is used to control a laser diode 21 in an optical transceiver for data transmission and telecommunications. The IC 11 has the capability of determining the first fault (temporal), out of a series of generated faults.

A particular embodiment as shown in the single FIGURE, features a laser driver electronic control circuit 20, which maintains constant optical power at a laser module 21. The laser driver 20 provides the laser module 21 with all control and sensor capabilities required to maintain proper operation. The laser module 21 typically accommodates a laser diode, a monitor PIN photodiode, a Peltier thermoelectric cooler (TEC), thermistor temperature sensors, and various associated circuit elements, such as resistors and capacitors. The laser driver electronic control circuit 20 supplies the drive current to the laser diode to achieve the required optical output, as well as another drive current to the TEC to cool the laser diode assembly to a prescribed temperature. The laser driver electronic control circuit 20 also monitors various operational parameters associated with the operation of the laser diode. For instance, sensors within laser module 21 as well as in the laser driver circuit 20 itself are generally provided to generate analog signals which correspond to the laser cathode voltage, the laser anode voltage, the current flowing in the laser cathode, the current flowing in the laser anode, the voltage on the feedback photodetector, the current in the feedback photodetector, and the temperature at various locations within the laser module 21 or in the laser driver circuit 20.

Laser driver systems, which include the laser module 21 and the integrated circuit 11 generally operate in dynamic environmental and operational settings, which at times can exceed the allowable ratings of the laser module 21, requiring corrective measures to be implemented, such as switching off the power supply to the laser module 21 to prevent damage to the system. There are many possible reasons that lead to improper laser operation: poor manufacturing procedures, printed circuit board (PCB) defects, extreme temperatures, and unauthorized user tampering, to name a few. Circuit countermeasures against deleterious operation therefore require analog checkpoints $CP_0 \ldots CP_n$ in the laser driver circuit 20 to monitor the analog signals generated by the sensors to ensure that the operational parameters remain within certain tolerances.

The analog checkpoints $CP_0 \ldots CP_n$ usually have analog comparators, which act as analog to digital converters, accepting an analog input and generating a digital output. These comparators have input reference levels, which are compared to those of the monitored operational parameters. While an operational parameter falls within its reference level, the digital output of the corresponding checkpoint $CP_i$ produces an output corresponding to a logical '0', corresponding to a normal condition, for instance. When that operational parameter falls outside its reference level, the digital output of the corresponding checkpoint $CP_i$ changes state to a logical '1', corresponding to a fault condition. Thus checkpoints $CP_0 \ldots CP_n$ covering 'n' operational parameters measured by 'n' individual sensors generate 'n' digital signals 22 as indicating their state.

Occasionally, for diagnostic or operational reasons, fault conditions at some of the checkpoints $CP_0 \ldots CP_n$ may need to be ignored or masked to prevent them from generating an alarm condition. For this purpose a mask bit register 17 can be used. The digital signal from each checkpoint $CP_0 \ldots CP_n$ is ANDed with a corresponding mask bit in the mask bit register 17 in a logic block 25, so that a host system 14 can disable any selected checkpoint $CP_0 \ldots CP_n$ by setting the appropriate mask bit to a logical '0'. The mask bit register 17, residing in Serial Peripheral Interface (SPI) registers 16, holds the desired mask state. Checkpoint states $CP_0 \ldots CP_n$ corresponding to a logic level "1" in the mask bit register 17 will pass through the logic block 25 for any checkpoint nodes switching from a logic "0" to a logic "1", where a "1" signifies a fault condition. From this point onward, further signal processing in integrated circuit 11 depends on the state of a first state register 18, which is set either by a micro-controller 12 over an SPI bus 13 or the host system 14 over the 12C bus 15.

For the case where the first state register 18 is enabled to trap the first fault, its state is set to a logic "1".

The micro-controller 12 or the host system 14 writes a logic "1" into the first state register 18 bit residing in SPI Core Register bank 16. When a fault is detected in a particular checkpoint $CP_i$ of the 'n' checkpoints $CP_0 \ldots CP_n$ of laser driver circuit 20, a signal 22 is transmitted to a single logic, 3-input AND gate $A_i$ in the logic block 25 which in turn passes through an n-wide OR gate 27. A state change of the OR gate 27 causes a RS flip-flop 28 to latch a logic "1" signal, which is passed on to a transmitter fault indicator 29 and a NAND gate 30 in the logic block 25. The output of the AND gate $A_i$ in the logic block 25 sets a corresponding flip-flop $FF_i$ of 'n' flip-flops $FF_0 \ldots FF_n$. The state of the flip-flops $FF_0 \ldots FF_n$ is transmitted to a status bits register 19, the content of which can be interrogated by the micro-controller 12 or the host system 14 over the respective buses, i.e. SPI bus 13 or 12C bus 15. Since both inputs of the NAND gate 30 are now set to logic "1", the NAND gate 30 output switches from a logic "1" to a logic "0" state. The resulting state change is fed to all the AND gates $A_0 \ldots A_n$ in logic block 25 so that any other fault signals coming from the laser driver 20 are blocked from passing through to the status bits register 19 in the SPI Core Register bank 16.

The other case is where the first state register 18 is enabled to pass all faults, being set to a logic "0" by the micro-controller 12 or by the host system 14.

After the micro-controller 12 or the host system 14 writes a logic "0" into first state register 18 residing in the SPI Core Register bank 16, any fault detected in a particular checkpoint $CP_i$ of the 'n' checkpoints $CP_0 \ldots CP_n$ of the laser driver 20 causes a logic "1" signal to be transmitted to a single logic AND gate $A_i$ in the logic block 25, as in the previous case.

The state of the AND gate $A_0 \ldots A_n$ outputs is transmitted to the n-wide OR gate 27. The RS flip-flop 28 latches the state of the OR gate 27 output and transmits it to NAND gate 30, as well as to the transmitter fault indicator 29. However, in this case the input of NAND gate 30 coming from the First Stat register 18 is set to logic "0", so the NAND gate 30 output remains in a logic "1" state. Because this logic "1" state on the output of the NAND gate 30 is ANDed with all the outputs of checkpoints $CP_0 \ldots CP_n$, subsequent faults that come from the laser driver 20 will set the corresponding flip-flops $FF_0 \ldots FF_n$ as they occur. The state of the flip-flops $FF_0 \ldots FF_n$ is transmitted to the status bits register 19 in the SPI Core Register bank 16 as in the previous case, thereby recording all fault occurrences.

A transmitter disabling circuit 23 as well as an external reset control 24 provide for resetting all recorded fault indications, both having an output in a logic "1" state under normal operation. If either or both of the two inputs to a NAND gate 26 are set to a logic "0" state, the output of the NAND gate 26 is set to a logic "1" state, which resets the RS flip-flops $FF_0 \ldots FF_n$ and 28 to a logic "0" state, which represents a no-error condition.

The Status Bits register 19 in the SPI Core Register bank 16 is used in conjunction with the micro-controller 12 to set the operating parameters of the laser driver 20 for controlling the laser module 21, including functions such as lowering or disabling the power supply to the laser module 21, adjusting temperature setting elements, and similar. The micro-controller 12 in turn may be controlled from the host system 14.

We claim:

1. A fault sensing apparatus in an integrated circuit for connecting to a laser module in a host system, comprising:
    a laser driving circuit (20) including a plurality of checkpoints, each checkpoint connected to a fault sensor for monitoring a plurality of operating faults in the laser module, wherein each checkpoint performs a comparison with a reference level and outputs a fault signal (22) based on the comparison;
    a status bit register for separately storing each of the fault signals to enable identification of each operating fault independently;
    a logic block between the checkpoints and the status bit register for receiving the fault signals and outputting alarm signals to the status bit register;
    a SPI core register bank including the status big register disposed to provide control signals to the logic block for connecting a selection of the fault signals to the alarm signals;
    a first fault state register in the SPI core register bank for controlling alarm signal acquisition;
    wherein the first fault state register is disposed to disable the logic block from outputting any subsequent alarm signals after a first occurrence of a fault signal has been detected.

2. The fault sensing apparatus according to claim 1, wherein the SPI core register bank includes a mask register to provide the selection of the fault signals for the logic block to connect to the alarm signals.

3. The fault sensing apparatus according to claim 1, wherein the status bit register is readable by a micro-controller to make a status of the fault signals available to the host system.

4. The fault sensing apparatus according to claim 1, wherein the SPI core register bank is settable by a micro-controller to permit the host system to control a mode of capturing the operating faults.

5. The fault sensing apparatus according to claim 1, further comprising a means to reset the status bit register.

* * * * *